United States Patent [19]
Thurn

[11] Patent Number: 6,107,722
[45] Date of Patent: Aug. 22, 2000

[54] ULTRASOUND TRANSDUCER

[75] Inventor: Rudolf Thurn, Pressath, Germany

[73] Assignee: Siemens AG, Munich, Germany

[21] Appl. No.: 09/000,395

[22] PCT Filed: Jul. 12, 1996

[86] PCT No.: PCT/DE96/01270

§ 371 Date: Jun. 15, 1998

§ 102(e) Date: Jun. 15, 1998

[87] PCT Pub. No.: WO97/03764

PCT Pub. Date: Feb. 6, 1997

[30] Foreign Application Priority Data

Jul. 24, 1995 [DE] Germany ............................ 195 27 018

[51] Int. Cl.$^7$ .................................................. H01L 41/04
[52] U.S. Cl. ........................ 310/322; 310/326; 310/334
[58] Field of Search ................................ 310/334, 336, 310/321, 322, 326

[56] References Cited

U.S. PATENT DOCUMENTS

| | | | |
|---|---|---|---|
| 3,928,777 | 12/1975 | Massa . | |
| 4,383,194 | 5/1983 | Ohigashi et al. | 310/326 |
| 4,803,763 | 2/1989 | Eturo et al. | 310/328 |
| 5,583,293 | 12/1996 | Flogel | 310/328 |
| 5,659,220 | 8/1997 | Thurn et al. | 310/369 |

FOREIGN PATENT DOCUMENTS

| | | |
|---|---|---|
| 25 41 492 C3 | 2/1980 | Germany . |
| 33 01 848 C2 | 11/1984 | Germany . |
| 39 20 663 A1 | 1/1991 | Germany . |
| 766983 | 1/1957 | United Kingdom . |
| WO 94/05004 | 3/1994 | WIPO . |

OTHER PUBLICATIONS

L.W. Anson et al., "On the problem of coupling of ultrasonic receivers to layered structures for process control", Ultrasonic, vol. 27 (Nov. 1989) pp. 331–342.

J. Koch, "Piezoxide (PXE)", Herausgebar: Valvo Unternehmensbereich Bauelemente der Philips GmbH, Hamburg, Jul. 1998, pp. 92–113.

*Primary Examiner*—Nestor Ramirez
*Assistant Examiner*—Peter Medley
*Attorney, Agent, or Firm*—Kenyon & Kenyon

[57] ABSTRACT

In an ultrasound transducer (1), a piezo-ceramic element (2) and an active materaial element (3) are joined to form a composite body in which the speed of sound is greater than in the piezo-ceramic element (2). This makes it possible to narrow the aperture angle Φ of the main sonic beam according to requirements.

10 Claims, 4 Drawing Sheets

ULTRASOUND TRANSDUCER

FIELD OF THE INVENTION

The present invention relates to an ultrasonic transducer having at least one piezoceramic element for emitting and receiving ultrasonic waves in a liquid or gaseous propagation medium, preferably for use in ultrasonic proximity switches.

BACKGROUND INFORMATION

Ultrasonic transducers of the generic type have been disclosed in numerous publications. In using such ultrasonic transducers in ultrasonic proximity switches and distance sensors, there is a need, inter alia, for a narrow sensing characteristic. Objects can be detected specifically thereby, while, as desired, lateral disturbing reflectors, for example, in cramped surroundings or in narrow passages, exert no influence on the functioning of the sensor. This requires ultrasonic transducers which exhibit a very narrow sound lobe characteristic and at the same time have very small minor lobe amplitudes.

German Patent No. 25 41 492 C2 describes the sharply directional ultrasonic transducer in saturn geometry which is most widespread in ultrasonic sensors in industrial use. It is assembled from a piezoceramic disk, an adapting layer disk and a concentric metal ring. The face of the adapting layer is large owing to a wide projection of the adapting layer disk beyond the diameter of the piezoceramic disk, as a result of which a very narrow aperture angle $\Phi$ of 5° is achieved for the sound lobe. Owing to the large projection of the adapting layer disk, it is difficult in practice always exactly to maintain the favorable vibration amplitude distribution and phase angle over the entire face, the result being problematic lateral minor lobes.

An ultrasonic transducer having a piezoceramic disk and a silicone adapting layer has furthermore been disclosed (see U.S. Pat. No. 3,928,777). The adapting layer has a diameter which is only slightly larger than the piezoceramic disk, the sound lobe opening angle $\Phi$ consequently being quite large at 10–12°. The minor lobes are so small, with an attenuation of more than –25 dB, that they no longer play a role in practical use. Because of its low chemical resistance, the adapting layer material of silicone cannot be used in all instances of application, and moreover has a strong temperature drift of the mechanical characteristics.

Published International Patent Application No. WO 94/05004 discloses an ultrasonic transducer having a lateral groove in the adapting layer disk. The adapting layer comprises a robust and resistant syntactic foam as in the case of the transducer using saturn geometry. This design has the same minor lobe freedom as the transducer having silicone. Because of its likewise small projection of the adapting layer disk, it also has an equally large sound lobe aperture angle $\Phi$ of 10–12°.

SUMMARY OF THE INVENTION

It is the object of present invention to provide an ultrasonic transducer which has a very narrow main lobe aperture angle and, if possible, at the same time, has minor lobe amplitudes which are so small that in practical application the latter do not exert a disturbing influence on the actual object detection. To be precise, the object detection can be falsified or rendered difficult by the unintended detection of lateral disturbing objects if the minor lobe amplitudes are not kept adequately small.

According to the present invention, this object is achieved by virtue of the fact that the piezoceramic element is joined, at least on one of the two base faces, to a plate-shaped material element, in which the speed of sound is higher than that in the piezoceramic element to form a composite element in which the resonant frequency in the transverse vibration mode is higher than the resonant frequency of the piezoceramic element. The increase resulting therefrom in the resonant frequency of the transverse modes transverse to the direction of the thickness of the plate-shaped composite element by comparison with the piezoceramic element operated in an isolated fashion leads to a narrower sound lobe aperture angle $\Phi$ when the transducer is operated on one of the frequency-increased transverse modes, and when one of the base faces is used as sound emitting surface. The term plate-shaped element denotes flat elements whose measurements are large in two dimensions by comparison with the measurements of the third dimension, which are denoted as plate thicknesses. A uniform plate thickness results in the case of a plane parallel plate. The thicknesses of the individual plate-shaped elements of the assembly are smaller in this case by a factor of at least 2 than that of the transverse measurements, which form the upper and lower base faces of the plates.

An advantageous embodiment is obtained when the piezoceramic element is constructed as a circular piezoceramic disk, and the material element is constructed as a circular material disk. This form leads to a rotationally symmetrical sound lobe which is advantageous in many applications. In addition, it is possible here to use the fundamental of the planar mode or radial vibration with a high degree of efficiency as an efficient mode for operating the transducer.

For specific applications, it is advantageous when the piezoceramic element and/or the material element have a rectangular or square base face. This leads, for example, to astigmatic shapes of sound lobes having aperture angles $\Phi$ of different size in terms of two mutually perpendicular planes along the central axis of the transducer. One of the efficient transverse modes of the length or width measurements of the rectangular shape is then used, for example, as a vibration ode.

An advantageous development results when the composite element is constructed as a layered assembly having at least two piezoceramic elements and at least two material elements, which are joined to one another in an alternating stratification. The use of a plurality of thin plate elements instead of a few thick ones produces a better mixture and a more homogeneous distribution of the mechanical material properties of the piezoceramic element and material element, with the result that higher resulting speeds of sound are achieved even in the case of the same proportion of the material element. It can also be advantageous to use a plurality of different materials for the material element and/or piezoceramic materials in a multilayered assembly.

For the purpose of better adaptation to the acoustic characteristic impedance of the surrounding sound propagation medium, the composite element is provided with at least one adapting layer whose characteristic impedance is between that of the composite element and that of the propagation medium. The thickness of the adapting layer preferably corresponds approximately to a quarter of the wavelength in the case of the operating frequency of the ultrasonic transducer. Suitable for the material of the adapting layer is syntactic foam consisting of a synthetic resin matrix such as, for example, epoxy resin, which is filled with hollow bodies made from glass, ceramic or similar. Also suitable are, for example, light materials such as aerogels or elastomeric materials such as silicones.

Circular composite element disks are preferably provided with adapting layer disks which are likewise circular. If the adapting layer disk is constructed such that it has a diameter which is equal to that of the composite element, or is similar to the diameter of the composite element within a deviation of 25%, this results, after fine tuning of the values of the diameter and thickness of the elements of the composite element as well as of the adapting layer element, and without further design aids, on the outer, sound-emitting base face of the adapting layer, in a distribution of the amplitude and phase of vibration which leads to very narrow sound lobes having extremely small minor lobe amplitudes.

A further advantageous embodiment of the ultrasonic transducer results when the disk-shaped adapting layer is provided with an adapted contour on its lateral surface and/or on its inner base face. The adapted contour comprises, for example, at least one indentation and/or bulge which have, for example, a round, triangular, rectangular or trapezoidal cross-section. The adapted contour can also simply consist in that the lateral surface of the adapting layer disk has a cross-section of oblique shape with a rectilinear or curved profile, with the result that the outer and the inner base face of the adapting layer are of different size. An adapted contour can be located on the inner base face of the adapting layer which here, for example, has the form of concentric grooves. It is possible by using these additional measures specifically to set desired transducer characteristics such as, for example, specific shapes of sound lobes adapted to the application.

It is also advantageous when the adapting layer is constructed as a cylindrical disk with a diameter which is larger than 1.25 times the largest diameter of the composite element, the region of the adapting layer which projects beyond the diameter of the composite element being provided, concentrically, on its rear side averted from the sound-emitting surface with an annular element made from metal or from the material of the adapting layer itself. In this embodiment, the enlargement of the emitting surface produces very narrow sound lobes, and at the same time it is ensured that the projecting region of the adapting layer vibrates largely with the same phase as the central region. There is correspondence to this extent with known transducers using saturn geometry, in which the projecting region of the adapting layer is likewise provided concentrically, on its rear side opposite the front emitting base face, with a flat, annular element made from metal.

DETAILED DESCRIPTION

Figure 1:
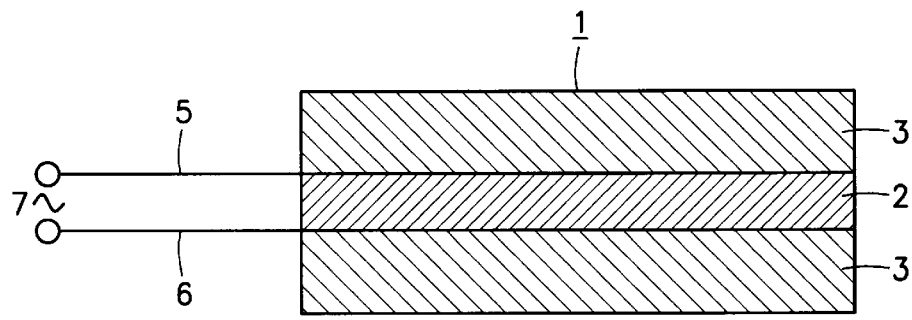
FIG. 1 shows a sectional view of a cylindrical, symmetrically designed ultrasonic transducer having a circular piezoceramic disk, surrounded on both sides by a circular material element disk in each case.

FIG. 1 shows by way of example an ultrasonic transducer 1 having a piezoceramic disk 2 with circular plain parallel base faces as the piezoceramic element which is joined on both end faces to a material disk 3 as material element. When electrically excited via contact wires at 5,6 which connect an excitation voltage 7 to the end face electrode surfaces (not represented) of the piezoceramic disk 2, the piezoceramic disk 2 executes radial planar vibrations. The resonant frequency of the planar mode, a transverse mode with a radial transducer direction, is determined by the disk diameter and by the speed of sound in the piezoceramic material, and is calculated for thin disks as $f_p=2*C_D/(\pi* d)$, where $f_p$= planar series resonant frequency, d=disk diameter, and $C_p$=speed of sound of the dilational wave. $C_D$ is calculated in this case as:

$$C_D = \sqrt{E/(\rho*(1-\mu^2))},$$

where E=modulus of elasticity, ρ=density and μ=poussin number. For a given diameter, the resonant frequency is determined by the speed of sound in the piezoceramic material. Joining the piezoceramic disk 2 to the material disks 3, which have a higher speed of sound than the piezoceramic disk 2, to form a composite element results in a higher effective speed of sound of the latter, by comparison with the piezoceramic disk 2; the effective speed of sound is between that of the piezoceramic element and that of the material element. As a result the fundamental resonant frequency of the planar mode of the composite element is increased, in conjunction with a constant diameter, with respect to the resonant frequency of the piezoceramic disk 2 operated in a isolated fashion, the aperture angle Φ of the main sound lobe of the emitted ultrasonic waves being reduced thereby. The point is that a relationship applies which states that the aperture angle Φ is smaller the larger the ratio of emitting surface to wavelength of the sound wave emitted into the surrounding medium.

Synthetic piezoelectric ceramics made from lead-zirconate-titanate compounds (PZT) which are at present in customary use have as disks a maximum dilational wave sound velocity of approximately 3500 m/s. Barium titanate ceramic has a higher speed of sound, but because of low Curie temperature it cannot be used for many industrial applications. A synthetic "piezoceramic element" having much higher speed of sound and resonant frequency can be produced using the solution of the composite element made from piezoceramic and a material element. Materials with high speeds of sound are suitable as material elements. These include, materials such as silicon, silicon dioxide, silicon nitride, silicon carbide or alumina. It would be possible to mention beryllium from among the metals, its value for the speed of sound being approximately 12600 m/s. Special steel alloys, nickel alloys such as inconal, titanium and aluminum etc. likewise have high speeds of sound. A further material property of the material element is the mechanical vibrational Q; if a transducer having high acoustic sensitivity is to be produced, a material having a high vibrational Q is selected. A material having a low vibrational Q is used for the case of a broadband transducer.

Figure 5:
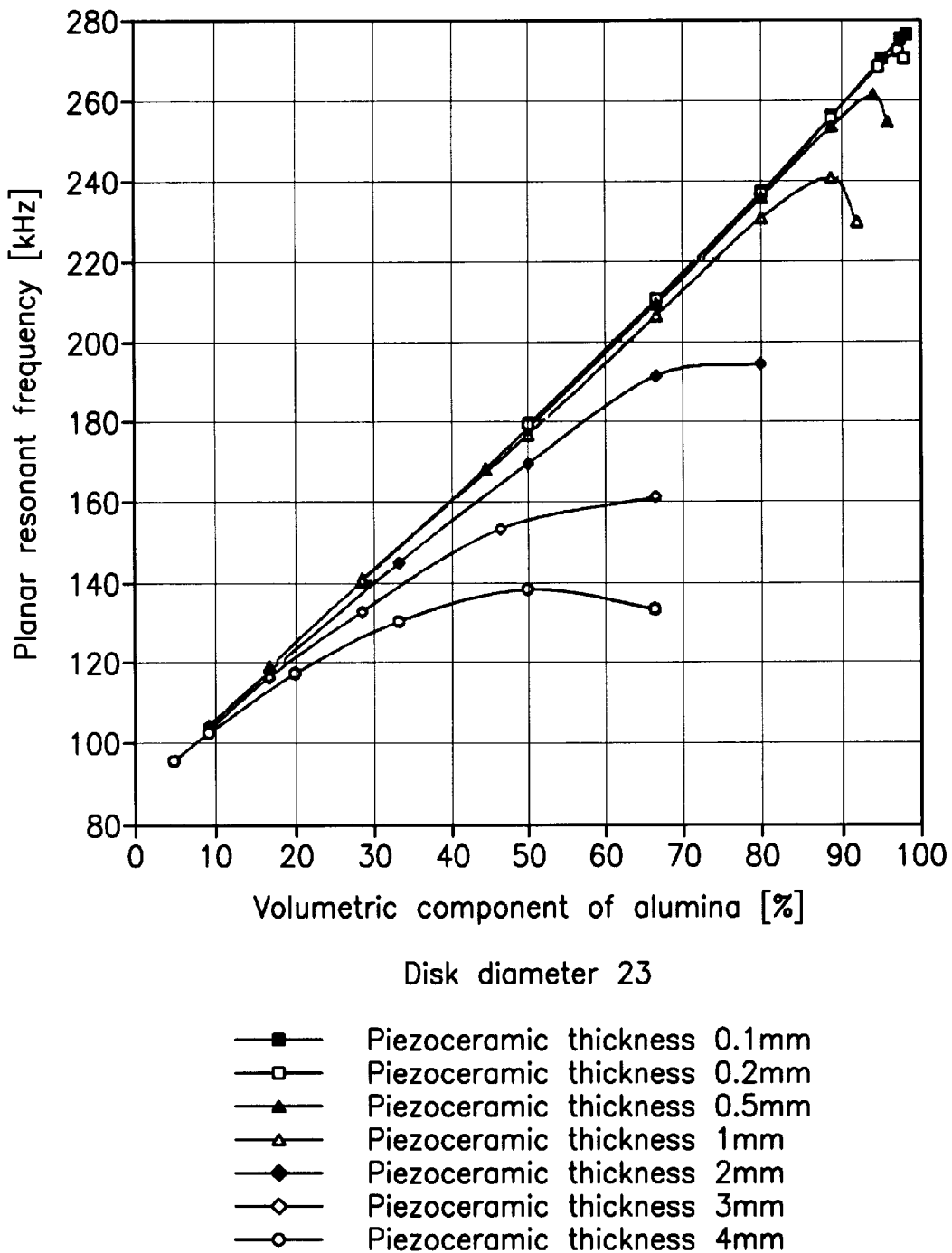
FIG. 5 shows a diagram with a graphical representation of the relationship between the effective speed of sound and the percentage proportion of the material element in a symmetrical assembly in accordance with FIG. 1.

The effective speed of sound and, hence, the planar resonant frequency of the assembly, can be substantially increased by the joining of the piezoceramic element and the material element. If, for example, use is made for the piezoceramic element of a PZT disk with a diameter of 23 mm and a thickness of 2 mm, the planar resonant frequency of this disk is 86 kHz. A material disk having the same measurements and made from alumina has its planar resonance at 282 kHz. A planar resonant frequency of 191 kHz is obtained for the assembly if, by analogy with the geometry of FIG. 1, the piezoceramic disk is joined by bonding, for example, concentrically on its two base faces to in each case one of the aluminuma disks. For the exemplary case, that, assuming the abovementioned diameter, the PZT disk is 0.5 mm thick and the alumina disk is 2 mm thick, a planar resonant frequency of 253 kHz results for the assembly. Where the PZT disk is 0.1 mm thick and the alumina layer is 2 mm thick, the result for the assembly is a planar resonant frequency of 275 kHz. The dependence of the resulting planar resonant frequency on the geometrical measurements of the symmetrical assembly comprising a PZT disk having two alumina disks of equal diameter in accordance with the geometry of FIG. 1 is represented in the diagram of FIG. 5 for the PZT disk thicknesses of 0.1, 0.2, 0.5, 1, 2, 3 and 4 mm. For small thickness values of the composite element, the resulting resonant frequency between the PZT resonance and alumina resonance is proportional to the volumetric component of the alumina in the total volume of the assembly. For volumetric components near 0% or near 100% alumina, the resonant frequency asymptotically approaches the resonant frequencies of the PZT disk and alumina disk. A deviation to lower resulting frequencies results for larger disk thicknesses and for total thicknesses of the composite element starting from approximately one third of the diameter. The reason for this behaviour is inferior coupling in the case of thicker disks or the interaction between the planar mode and the thickness mode of the composite element.

When alumina is used, the planar frequency of the assembly can be increased in conjunction with a constant diameter by more than a factor of 3 by comparison with the PZT disk; smaller values of the planar frequency can be set virtually continuously by selecting the suitable combination of piezoceramic thickness and material thickness (see FIG. 5). The rule in this case is that the frequency is higher the higher the self-resonant frequency of the material element, the higher the relative material element component and the thinner the piezoceramic thickness. In the case of an increase in frequency by a factor of 3, the sound lobe width is reduced to the same extent. If the 3 dB width of the aperture angle Φ is approximately 12° in the case of the PZT disk operated in an isolated fashion, the reduction by a factor of 3 produces a lobe width Φ of 4°. If, for example, silicon carbide or beryllium, whose speed of sound is above that of alumina, is used as material element, correspondingly still higher resulting resonant frequencies are produced, with the result that aperture angles Φ of approximately 3° are obtained thereby. Assembly geometries with smaller increases in frequency lead to sound lobes which are correspondingly wider in proportion, with the result that it is possible by a simple selection of a suitable combination of piezoceramic material and piezoceramic thickness and of the material of the material element and the thickness thereof to realise virtually all lobe aperture angles Φ of between approximately 3° and 12° continuously. Enlargement or reduction to scale leads in a known way to transducers having the same shapes of the sound lobes with in conjunction correspondingly higher or lower operating frequencies.

Figure 2:
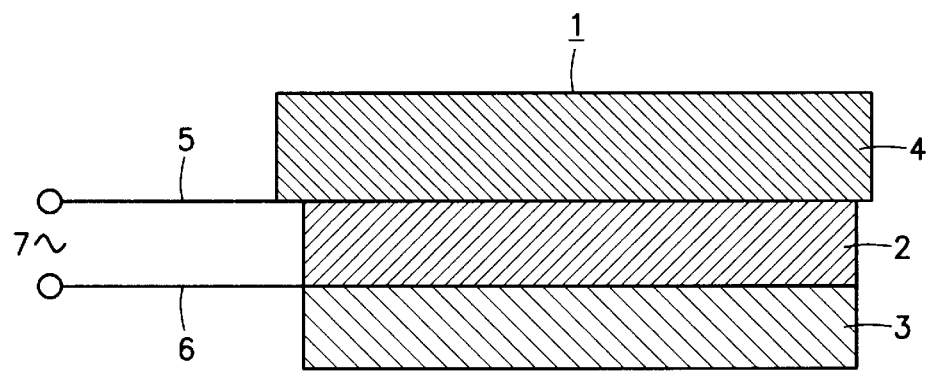
FIG. 2 shows a sectional view of a circular ultrasonic transducer having a material element disk, a piezoceramic disk and an adapting layer disk.
Figure 3:
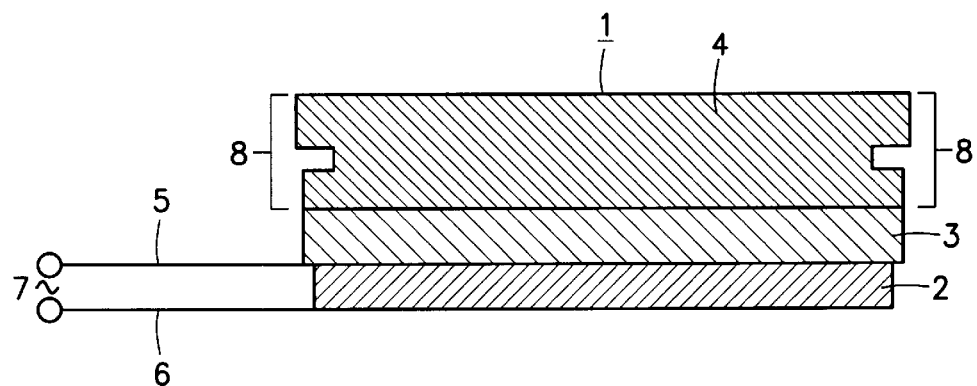
FIG. 3 shows a sectional view of a circular ultrasonic transducer having a piezoceramic disk, a material element disk and an adapting layer disk with an adapted contour on the lateral surface.

FIG. 2 shows an ultrasonic transducer 1 having a PZT disk 2 with a diameter of 23 mm and a thickness of 2.5 mm, which is provided on its rear base face with an alumina disk 3 of the same diameter and with a thickness of 3.5 mm, as well as, on its front base face, with an adapting layer disk 4 made from a mixture of hollow epoxy and glass balls and having a diameter of 24 mm and thickness of 3.2 mm. The operating frequency of this exemplary transducer is 160 kHz, in conjunction with a width Φ of the main lobe of 6°, and in conjunction with a minor lobe attenuation of better than −25 dB. FIG. 3 shows a transducer 1 having a PZT disk 2, on one of whose base faces a material element disk 3 is mounted. The latter, in turn, is joined to an adapting layer disk 4 which is provided on its lateral surface with an adapted contour 8. The thicknesses of the PZT disks and of the alumina disks are preferably between 5% and 20% of the disk diameter for the geometries of FIG. 2 and FIG. 3.

Figure 4:
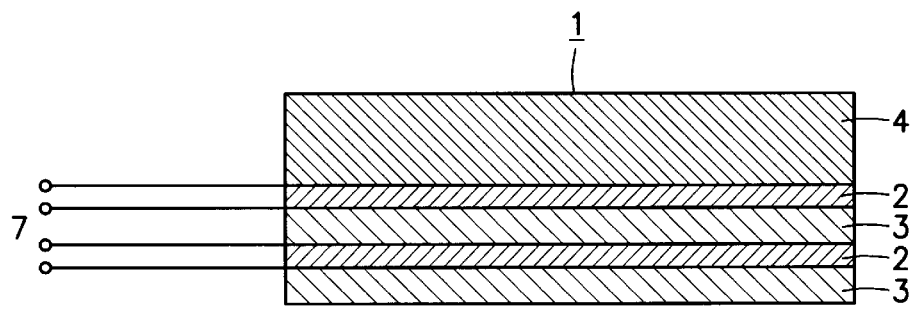
FIG. 4 shows a sectional view of a circular ultrasonic transducer having a multilayered assembly made in each case of two piezoceramic disks and two material element disks, provided with an adapting layer disk.

Represented in FIG. 4 is a cylindrical ultrasonic transducer 1 of simple design and having a multilayered composite element which is assembled from two PZT disks 2 and two alumina disks 3. An adapting layer disk 4 made from a mixture of hollow epoxy and glass balls is mounted on the upper PZT disk. In the case of this multilayered assembly, or of designs of related type having yet more layer elements, advantageous thicknesses of the piezoceramic disk and material element disk are between approximately 0.5% and 15% of the disk diameter. The individual layer elements of the exemplary transducer 1 have a uniform diameter of 23 mm. The thickness of the two PZT disks 2 is 0.5 mm, in each case, the thickness of the alumina disks 3 is 1 mm in each case, and the adapting layer disk 4 is 2.1 mm thick. The transducer 1 has an operating frequency of 265 kHz, a width Φ of the main lobe of 4°, and a minor lobe attenuation of better than −30 dB.

Figure 6:
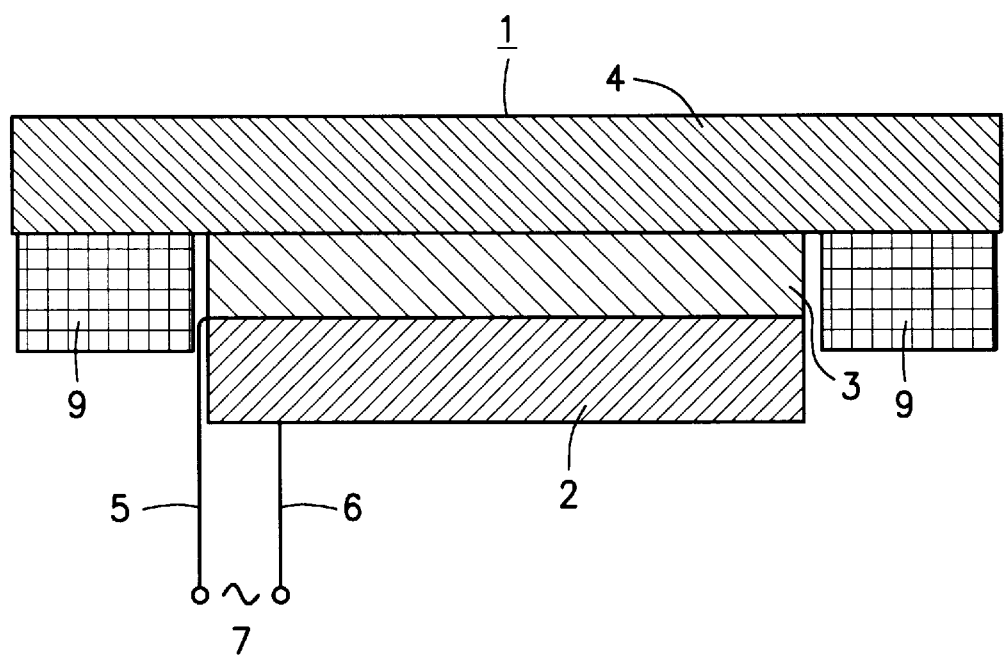
FIG. 6 shows a sectional view of a rotationally symmetrical ultrasonic transducer having a piezoceramic disk, a material element disk, and an adapting layer disk with a large projection and with a concentric metal ring on the rear side of the adapting layer disk.

FIG. 6 shows an ultrasonic transducer 1 which is of a similar design to the saturn geometry and has a PZT disk 2, a material element disk 3 of the same diameter, and an adapting layer disk 4 which is made from a mixture of hollow epoxy and glass balls and has a substantially larger diameter than that of the PZT material element assembly 2,3. In order that the projecting outer part of the adapting layer disk 4 vibrates in the correct phase with the central part, an annular perforated disk 9 made from metal is mounted concentrically on the rear side, opposite of the sound-emitting front base face, of the projecting part of the adapting layer 4. Thus, the emitting surface which is greatly enlarged in this way permits aperture angles Φ of the sound lobe of below 3°, in the vicinity of 2°.

What is claimed is:

1. An ultrasonic transducer, comprising:
    a plate-shaped piezoceramic element, having an upper base face and a lower base face, for emitting ultrasonic waves into a propagation medium; and
    a plate-shaped material element, having an upper base face and a lower base face, in which the speed of sound is higher than that in the piezoceramic element,
    wherein the piezoceramic element is joined on at least one of the two base faces to at least one of the two base faces of the material element to form a composite element in which the resonant frequency in a transverse vibration mode is higher than a resonant frequency of the piezoceramic element.

2. The ultrasonic transducer according to claim 1, wherein the base faces of both the piezoceramic element and of the material element are of similar size, such that they deviate from one another by not more than 50% in terms of area.

3. The ultrasonic transducer according to claim 1, wherein the piezoceramic element is constructed as a circular piezoceramic disk, and the material element is constructed as a circular material disk.

4. The ultrasonic transducer according to claim 1, wherein at least one of the piezoceramic element and the material element has a rectangular base face.

5. The ultrasonic transducer according to claim 1, wherein a composite element including the piezoceramic and plate-shaped material elements is constructed as a layered assembly having at least two piezoceramic elements and at least two material elements, which are joined to one another in an alternating stratification.

6. The ultrasonic transducer according to claim 1, wherein the ultrasonic transducer is embedded in an elastic, vibration-damping material.

7. The ultrasonic transducer according to claim 1, further comprising:

at least one plate-shaped adapting layer, provided on a base face of the composite element, for adapting to the characteristic impedance of the surrounding propagation medium, and wherein an outer base face of the adapting layer is a sound-emitting surface of the ultrasonic transducer.

8. The ultrasonic transducer according to claim 7, wherein the adapting layer has the form of a circular disk whose diameter deviates by not more than 25% from the largest diameter of the composite element.

9. The ultrasonic transducer according to claim 7, wherein the adapting layer is provided with an adapted contour on at least one of a lateral surface and an inner base face.

10. The ultrasonic transducer according to claim 7, wherein the adapting layer is constructed as a cylindrical disk with a diameter which is larger than 1.25 times a largest diameter of the composite element, and further wherein a region of the adapting layer which projects beyond the largest diameter of the composite element is provided concentrically, on a rear side averted from the sound-emitting surface, with an annular element made from one of a metal and a material of the adapting layer.

* * * * *